(12) United States Patent
Yang et al.

(10) Patent No.: US 7,038,263 B2
(45) Date of Patent: *May 2, 2006

(54) INTEGRATED CIRCUITS WITH RHODIUM-RICH STRUCTURES

(75) Inventors: Haining Yang, Boise, ID (US); Dan Gealy, Kuna, ID (US); Gurtej S. Sandhu, Boise, ID (US); Howard Rhodes, Boise, ID (US); Mark Visokay, Richardson, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/850,664

(22) Filed: May 21, 2004

(65) Prior Publication Data

US 2004/0212002 A1    Oct. 28, 2004

Related U.S. Application Data

(63) Continuation of application No. 10/318,597, filed on Dec. 12, 2002, now Pat. No. 6,781,175, which is a continuation of application No. 09/789,335, filed on Feb. 20, 2001, now Pat. No. 6,518,610.

(51) Int. Cl.
  H01L 27/108   (2006.01)
  H01L 29/76    (2006.01)
  H01L 29/94    (2006.01)
  H01L 31/119   (2006.01)

(52) U.S. Cl. ..................... 257/295; 257/306

(58) Field of Classification Search ........ 257/295–310, 257/532
See application file for complete search history.

(56) References Cited

U.S. PATENT DOCUMENTS

| | | | |
|---|---|---|---|
| 5,504,041 A | 4/1996 | Summerfelt | 437/235 |
| 5,576,928 A | 11/1996 | Summerfelt et al. | 361/321.1 |
| 5,619,393 A | 4/1997 | Summerfelt et al. | 361/321.1 |
| 5,622,893 A | 4/1997 | Summerfelt et al. | 438/396 |
| 5,729,054 A | 3/1998 | Summerfelt et al. | 257/751 |
| 5,751,540 A | 5/1998 | Lee et al. | |
| 5,807,774 A * | 9/1998 | Desu et al. | 438/3 |
| 5,844,318 A | 12/1998 | Sandhu et al. | 257/774 |
| 5,874,364 A | 2/1999 | Nakabayashi et al. | |
| 5,963,835 A | 10/1999 | Sandhu et al. | 438/681 |
| 5,989,338 A | 11/1999 | DeBoer et al. | 117/84 |
| 6,046,469 A * | 4/2000 | Yamazaki et al. | 257/306 |
| 6,090,701 A | 7/2000 | Hasunuma et al. | |
| 6,169,305 B1 * | 1/2001 | Takai et al. | 257/306 |
| 6,177,284 B1 | 1/2001 | Horii et al. | |
| 6,177,351 B1 * | 1/2001 | Beratan et al. | 438/694 |
| 6,180,974 B1 | 1/2001 | Okutoh et al. | |
| 6,232,174 B1 | 5/2001 | Nagata et al. | |

(Continued)

OTHER PUBLICATIONS

Kodas et al. "*The Chemistry of Metal CVD*" (Jan 1994) Chapter 8, pp. 397-398 and 408.

Koops et al."*Fabrication and Characterization of Platinum Nanocrystalline Material Grown By Electron-Beam Induced Deposition*" —J. Vac. Sci Technol. B 13(6), Nov/Dec 1995, pp. 2400-2403.

(Continued)

*Primary Examiner*—Cuong Nguyen
(74) *Attorney, Agent, or Firm*—Knobbe, Martens, Olson & Bear, LLP

(57) ABSTRACT

A structure and method are disclosed for forming a capacitor for an integrated circuit. The capacitor includes a rhodium-rich structure, a rhodium oxide layer in direct contact with the rhodium-rich structure, a capacitor dielectric in direct contact with the rhodium oxide layer and a top electrode over the capacitor. The rhodium-rich structure can include rhodium alloys and the capacitor dielectric preferably has a high dielectric constant.

32 Claims, 5 Drawing Sheets

U.S. PATENT DOCUMENTS 6,482,736 B1   11/2002   Basceri et al.
6,518,610 B1 *  2/2003   Yang et al. ................. 257/295
6,781,175 B1 *  8/2004   Yang et al. ................. 257/295

OTHER PUBLICATIONS

Aoyama et al. "*Ru Electrode Deposited by Sputtering in Ar/$O_2$ Mixture Ambient*"—Japanese J. Appl. Phys. vol 37 (1998) pp. 5701-5707.

Aoyama et al. "*Interfacial Layers Between Si and Ru Films Deposited By Sputtering In Ar/$O_2$ Mixture Ambient*"—1998 Publication Board, Japanese Journal of Applied Physics, pp. L242-244.

PCT International Search Report dated Mar. 21, 2003.

"A Stacked Capacitor Technology with ECR Plasma MOCVD (Ba,Sr)$TiO_3$ and $RuO_2$/RU/TiN/$TiSi_x$ Storage Nodes for G-b-Scale Dram's," IEEE Transactions on Electron Devices, vol. 44, No. 7, Jul. 1, 1997, pp. 1076-1083.

"Novel High Temperature Multilayer Electrode-Barrier Structure for High-Density Ferroelectric Memories," Applied Physics Letters, vol. 71, No. 5, Aug. 4, 1997, pp. 719-721.

"Fatigue of Organometallic Chemical Vapor Deposited PbZr$_x$Ti$_{1-x}$O$_3$ Thin Films with Ru/$RuO_2$ and Pt/Pt electrodes," Thin Solid Films, vol. 263, No. 2, Jul. 15, 1995, pp. 221-230.

* cited by examiner

INTEGRATED CIRCUITS WITH RHODIUM-RICH STRUCTURES

RELATED APPLICATIONS

This application is a continuation application of U.S. application Ser. No. 10/318,597, entitled "RHODIUM-RICH INTEGRATED CIRCUIT CAPACITOR ELECTRODE," filed Dec. 12, 2002 now U.S. Pat. No. 6,781,175, which is a continuation application of U.S. application Ser. No. 09/789,335, filed Feb. 20, 2001, now U.S. Pat. No. 6,518,610, issued on Feb. 11, 2003, entitled "RHODIUM-RICH OXYGEN BARRIERS," the entirety of which is hereby incorporated by reference. This application is also related to U.S. application Ser. No. 10/209,386, entitled "METHODS TO FORM RHODIUM-RICH OXYGEN BARRIERS," filed Jul. 30, 2002.

BACKGROUND OF THE INVENTION

1. Field of the Invention

This invention relates to electrode structures that have good, reliable, robust contact to insulator materials having high dielectric constants, and, in particular, to forming capacitors in microelectronic devices with these electrode structures and high dielectric constant materials.

2. Description of the Related Art

Capacitors are critical devices in integrated circuit designs, particularly for high density memory chips such as dynamic random access memories (DRAMs).

Capacitance is proportional to both the electrode area in contact with the dielectric and the dielectric constant of the insulating material. As the trend toward increasing the number of devices on a single chip has made it necessary to make devices smaller and smaller, the way in which capacitors are fabricated has had to change. The problem of how to increase electrode contact area without using a lot of surface area on the chip has been addressed by changing the topography of capacitors. Former "flat sandwich" configurations, wherein the device consists of planar layers, one on top of another, have given way to "container" and "stud" configurations, among others.

A container capacitor is made inside a hole or via in a layer of insulating material. The layered structure forming the capacitor conforms to the shape of the via as the layers are deposited one on top of another. Thus, the electrode contact area includes both the cylindrical side surface of the container and the circular bottom. In some designs, the outside cylindrical surface can also be made available. Yet the capacitor uses a chip surface area ("footprint") that is only the size of the circular top opening of the via.

Similarly, capacitors can be made in a stud configuration, wherein a column of electrode material is made through a series of deposition, photolithography and etch steps, and additional capacitor layers are deposited over the column, conforming to its outer surface. Again, the surface area of the chip occupied by the capacitor is small compared to the total electrode/dielectric contact area, or effective capacitor surface area, which includes the cylindrical side surface of the column, as well as the top portion.

Another way to get more capacitance out of a small area is to use dielectric materials with high dielectric constants (k), so-called HDCs, such as barium strontium titanate (BST) or tantalum oxide ($Ta_2O_5$). A difficulty with these materials is that they tend to lose oxygen during high-temperature processing, which causes undesirable changes in their dielectric properties and may oxidize nearby materials. Additionally, most processes for forming these materials involve highly oxidizing environments that can corrode conductive elements of the integrated circuit, such as underlying polysilicon plugs.

Accordingly, there is a need for processes and materials for formation of capacitors in integrated circuits, which are compatible with use of high dielectric materials. It would be advantageous to use a material that is a barrier to oxygen diffusion from these HDC's and also has the electrical conductivity characteristics necessary for a capacitor electrode.

SUMMARY OF THE INVENTION

In accordance with one aspect of the invention, a capacitor is provided within an integrated circuit. The capacitor includes a rhodium-rich structure, a rhodium oxide layer in direct contact with the rhodium-rich structure, a capacitor dielectric in direct contact with the rhodium oxide layer, and a top electrode over the capacitor dielectric. In the illustrated embodiments, the capacitor may have a stud or container shape, may contain noble metal alloys in the rhodium-rich structure and preferably employs high dielectric constant materials for the capacitor dielectric.

In accordance with another aspect of the invention, an electrode, consisting of a series of layers, for a semiconductor device. The electrode includes a first layer that includes a noble metal, and a second layer having more than 50 atomic percent rhodium.

In accordance with another aspect of the invention, a method of fabricating an integrated circuit. The method includes depositing a rhodium-rich layer and depositing a dielectric material thereover. The dielectric material has a dielectric constant greater than about 5.

BRIEF DESCRIPTION OF THE DRAWINGS

These and other aspects of the invention will be readily apparent to the skilled artisan in view of the detailed description below and the appended drawings, which are meant to illustrate and not to limit the invention, and in which.

DETAILED DESCRIPTION OF THE PREFERRED EMBODIMENT

While illustrated in the context of high dielectric constant capacitors, the skilled artisan will readily find application for the principles and advantages disclosed herein for other electrical applications. The electrodes have particular utility adjacent volatile materials, or when processed in highly oxidizing environments.

It is very desirable to use HDC (high dielectric constant) materials, such as barium strontium titanate (BST), tantalum oxide ($Ta_2O_5$), hafnium oxide ($HfO_2$), zirconium oxide ($ZrO_2$), hafnium silicate ($HfO_2$—$SiO_2$), zirconium silicate ($ZrO_2$—$SiO_2$), alumina ($Al_2O_3$) or niobium oxide ($Nb_2O_3$), in capacitors for integrated circuits, as they provide greater capacitance density than do materials with lower dielectric constants and, thus, yield a greater capacitance for a smaller surface area. Unfortunately, these materials tend to lose oxygen during subsequent high-temperature processing, which can result in leakage current through the capacitor and in oxidation of surrounding materials during deposition, curing and throughout the fabrication of the integrated circuit.

Conductive electrode layers in contact with the HDC material are the other components necessary to make a complete capacitor structure. The bottom electrode must be able to maintain good electrical contact between the HDC material and the substrate and to withstand highly oxidizing environments during deposition and annealing of the HDC, typically at temperatures greater than 600 C. Some noble metals, such as platinum, are unreactive with respect to oxygen, but allow diffusion of oxygen through them, which can lead to oxidation of nearby materials, such as the underlying contact plug and the silicon substrate. Oxidation, of course, can decrease or destroy the conductivity of these elements.

The preferred embodiments of the current invention employ a capacitor electrode structure having a high rhodium (Rh) content, which serves as both an oxygen diffusion barrier and a conductor. The Rh-containing layer can comprise pure Rh metal or an alloy that contains a high level of Rh. After fabrication of this electrode, which can be done in any number of ways, as will be discussed below, the Rh-containing structure makes it possible to carry out subsequent high-temperature process steps without degrading the HDC, without oxidizing surrounding materials and without losing the conductive properties of the electrode. The illustrated electrodes include at least a thin interfacial layer of $RhO_x$ in direct contact with the dielectric. Furthermore, rhodium oxide can form preferentially along grain boundaries of the Rh or Rh alloy electrode structure, thus blocking what are normally fast diffusion paths for oxygen.

Figure 1:
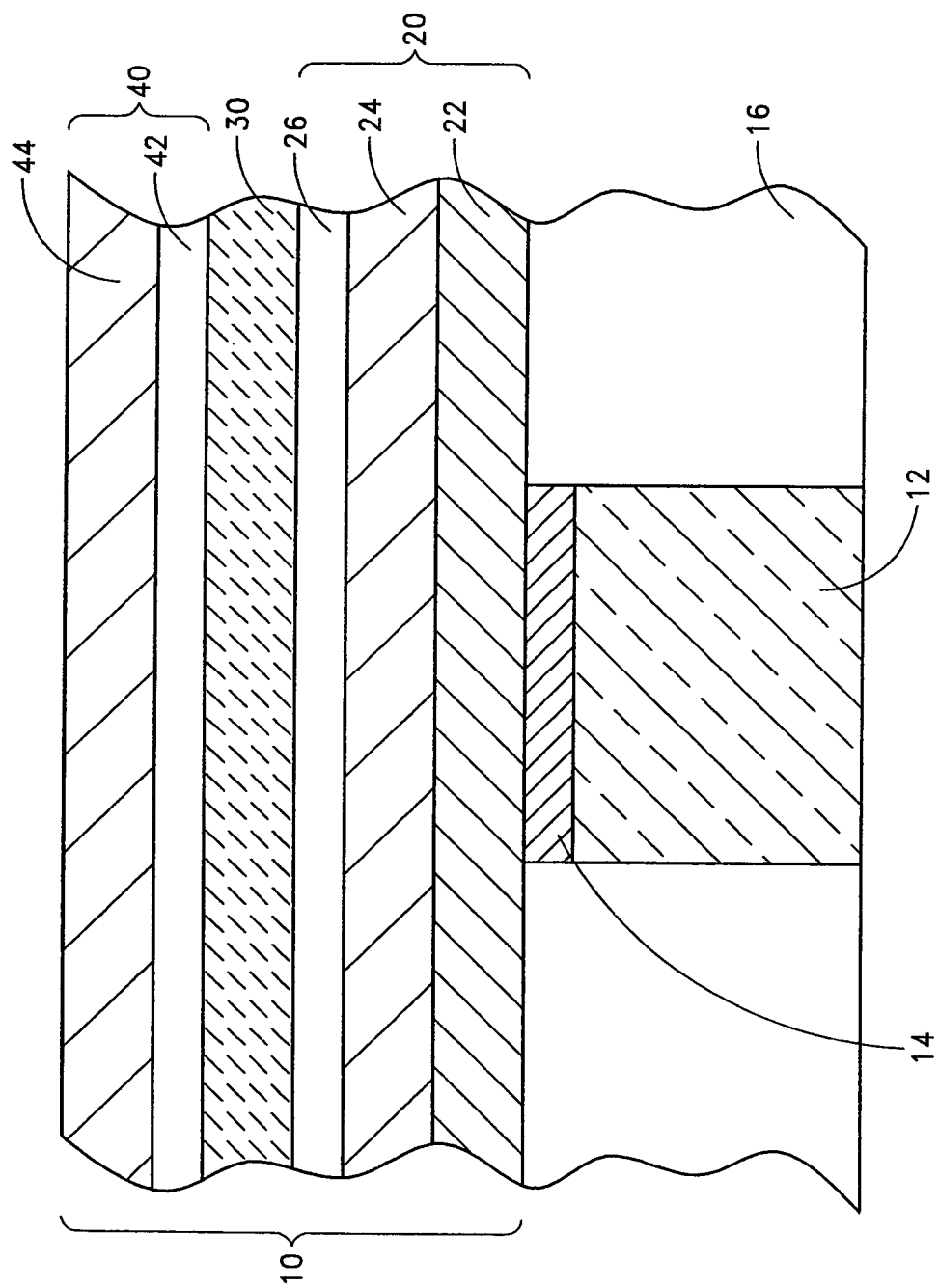
FIG. 1 is a schematic cross-section of a capacitor structure, constructed in accordance with the preferred embodiments.

With reference to FIG. 1, a capacitor 10, constructed in accordance with the preferred embodiments is shown schematically. The diagram is not drawn to scale. The capacitor 10 is formed over a contact 12 forming a conductive path to underlying circuit components. This contact 12 comprises a polysilicon plug in the preferred embodiment and, more preferably, includes a conductive diffusion barrier 14, such as a thin titanium nitride layer, on its surface. The contact 12 typically extends through an insulating layer 16 to an active area of a transistor in a semiconductor substrate (not shown). The substrate generally comprises the lowest level of semiconductor material in which devices are formed. Exemplary substrates comprise single-crystal silicon wafers, epitaxial silicon layers, gallium arsenide and other III–V material layers.

The capacitor 10 includes a first or bottom electrode 20 that includes a plurality of conductive layers. At least one of the layers is rhodium-rich, i.e., contains more than about 50 atomic percent rhodium. The rhodium-rich layer preferably has greater than about 60 atomic percent rhodium, more preferably between about 70 atomic percent and 90 atomic percent rhodium.

The illustrated bottom electrode 20 includes a first or structural conductive layer 22, which can comprise a noble metal, metal alloy, metal compound, polysilicon or a combination thereof (e.g., titanium nitride over polysilicon). As will be appreciated from the examples of FIGS. 3–5, the structural layer 22 can define the basic shape of the capacitor 10. The skilled artisan will readily appreciate, however, that the first layer can be omitted in favor of defining the capacitor shape directly with the rhodium-rich structure 24.

The illustrated bottom electrode 20 shows a rhodium-rich structure 24 overlying the first conductive layer 22. The structure 24 can include one or more rhodium-rich layers. Preferred examples include "pure" (>96%) rhodium; a rhodium-rich alloy, preferably with a noble metal; and a bilayer of pure rhodium over a rhodium-rich alloy with a noble metal. Noble metals, as used herein, include ruthenium, palladium, osmium, iridium, platinum, silver and gold. Platinum is most preferred in the rhodium-rich alloy. In a bilayer, the alloy is preferably rhodium-rich, although it will be understood that the structure 24 can be rhodium-rich even with a small amount of rhodium in the alloy, if a relatively thick pure rhodium layer overlies the alloy.

As shown, the bottom electrode 20 also includes a rhodium oxide ($RhO_x$) layer 26 formed directly over the rhodium-rich structure 24. As will be appreciated from the discussion of FIG. 2 below, the rhodium oxide layer 26 can comprise a thin interfacial layer, formed naturally during high k dielectric deposition and curing, but more preferably comprises a deposited or grown layer. More preferably, the rhodium oxide layer 26 comprises stoichiometric $Rh_2O_3$.

The illustrated dielectric layer 30 is a material with a high dielectric constant, k. High dielectric constant materials, known as HDCs, as used herein, include materials whose dielectric constant is greater than 5, more preferably greater than 10 and most preferably greater than 20. Preferred materials that meet these criteria include barium strontium titanate (BST), tantalum oxide ($Ta_2O_5$), hafnium oxide ($HfO_2$), zirconium oxide ($ZrO_2$), hafnium silicate ($HfO_2$—$SiO_2$), zirconium silicate ($ZrO_2$—$SiO_2$), alumina ($Al_2O_3$) and niobium oxide ($Nb_2O_3$).

The capacitor 10 includes a second or top electrode 40 that also comprises a plurality of conductive layers. The rhodium oxide layer ($RhO_x$) 42 is analogous to the $RhO_x$ layer 26 in the bottom electrode 20. This top electrode $RhO_x$ layer 42 can be formed as a thin interfacial layer, when curing of the HDC layer is done subsequent to deposition of the rhodium-rich layer 44 or during other subsequent heat treatments of the integrated circuit.

In another arrangement, the $RhO_x$ layer 42 is formed by deposition of a thin film of pure rhodium, and then oxidizing it fully. More preferably, the $RhO_x$ layer 42 is deposited directly onto the HDC layer by chemical vapor deposition. Most preferably, the resulting oxide comprises stoichiometric $Rh_2O_3$.

Overlying the $RhO_x$ layer in the illustrated top electrode is a rhodium-rich structure 44, analogous to the rhodium-rich structure 24 in the bottom electrode. The structure 44 can include one or more rhodium-rich layers. As described for structure 24 above, preferred examples include "pure" (>96%) rhodium; a rhodium-rich alloy, preferably with a noble metal; and a bilayer of pure rhodium over a rhodium-rich noble metal alloy. Again, platinum is most preferred in the rhodium-rich alloy. As is known in the art, the top electrode can then be patterned, either for each individual cell or for each array.

Figure 2:
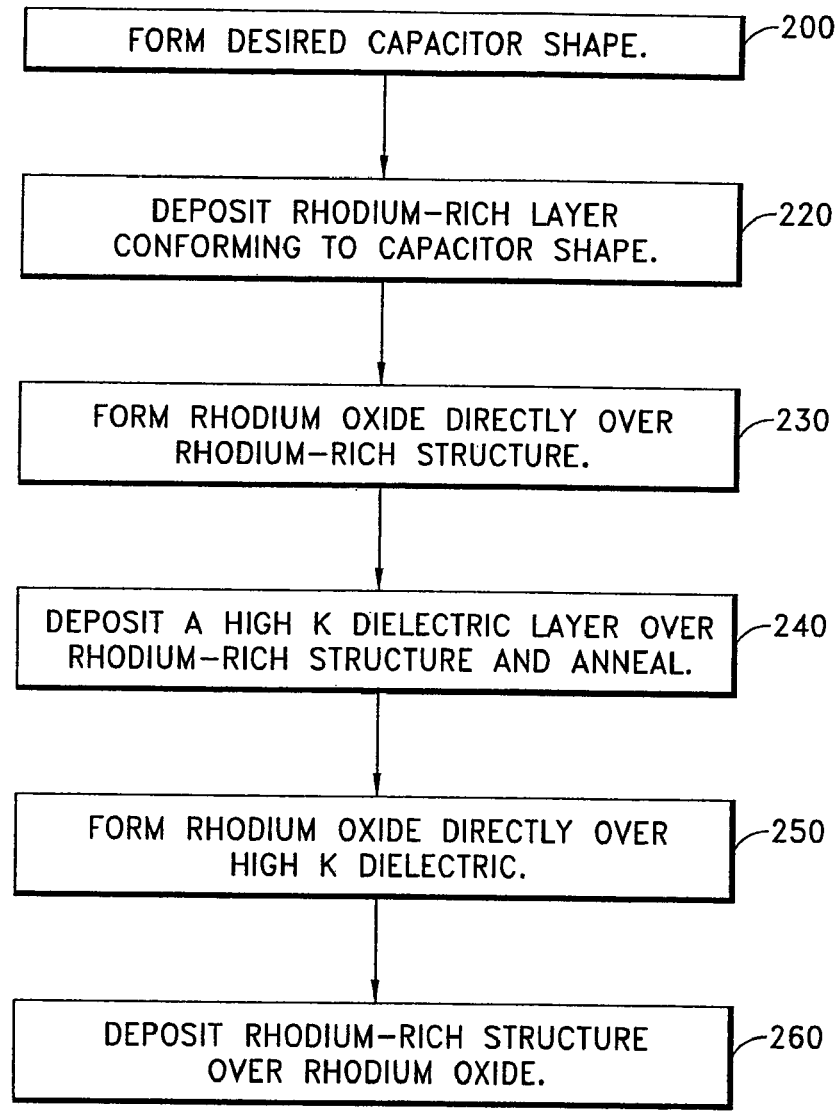
FIG. 2 is a flow chart showing the steps for executing a preferred method of the present invention.

The capacitor is fabricated according to the method outlined in the flow chart of FIG. 2. The desired capacitor shape can be formed 200 in any of a number of configurations, preferably, as noted in the discussion of FIG. 1, by shaping the structural layer 22. Various possibilities include flat sandwich structures, wherein the device consists of planar layers as shown in FIG. 1, folding stacked or trench structures and structures with rugged surfaces. These examples are meant here to aid in illustrating embodiments of the invention and not to exclude other configurations that may be used by one of ordinary skill in the art.

Preferred embodiments for capacitor shape include container and stud structures. A container structure is fabricated inside a hole that has been formed in a layer of insulating material. For example, the structural conductive layer 22, shown in FIG. 1, can be deposited to conform to the shape of the hole, and the other structures comprising the capacitor are formed over this layer within the hole, as will be discussed below. A stud structure obtains when structural layer 22 forms a column of material, and subsequent capacitor structures are formed over this column. The skilled artisan will be familiar with the procedure involved in forming these initial hole and column structures, which include deposition, photolithography and etch steps.

With continuing reference to FIG. 2, a rhodium-rich structure is deposited over and conforms with the capacitor shape 220. In the preferred embodiment, the structure is formed by chemical vapor deposition (CVD), more preferably metal organic chemical vapor deposition (MOCVD). As discussed above in reference to FIG. 1, the rhodium-rich structure can include one or more rhodium-rich layers and that the term rhodium-rich can mean pure rhodium, i.e., more than 96 atomic percent rhodium, or a rhodium-rich noble metal alloy, wherein the rhodium content is at least 50 atomic percent, preferably greater than 60 atomic percent, and, more preferably between 70 atomic percent and 90 atomic percent.

The precursor gas used to form the pure Rh layer by CVD or MOCVD can be chosen from a number of volatile rhodium compounds, including $Rh_2(\mu-Cl)_2(CO)_4$, $Rh(\eta^5-C_5H_5)(CO)_2$, $Rh(\eta^5-C_5H_5)(1.5-COD)$, $Rh(\eta^3-allyl)(CO)_2$, $Rh(\eta^3-allyl)_3$ and $((PF_3)_2RhCl_2)_2$. Other known and yet-to-be developed volatile rhodium compounds can also be employed. In the preferred embodiment, $Rh(\eta^5-C_5H_5)(CO)_2$ is used. The deposition temperature is preferably between about 200 C and 550 C, more preferably, between 250 C and 500 C. Preferred carrier gases are helium and argon. Those skilled in the art will understand that deposition conditions must be optimized for each precursor gas through experimentation. Although films deposited under vacuum with organic source gases may be significantly contaminated with carbon and oxygen, when the precursor gas is combined with hydrogen, the purity of the deposited rhodium film can be greater than 90%, and even as high as 98%.

When a rhodium-rich alloy is deposited by MOCVD in another arrangement, the gases used to form the layer are a combination of the gases that form the pure elements. The rhodium-rich alloy that is most preferred is Rh—Pt. An exemplary precursor gas for platinum is methyl-cyclopendadienylplatinum(IV)-trimethyl ($MeCpPt(Me)_3$). This gas is combined with a rhodium precursor gas in a proportion to produce the desired alloy composition in the deposited film. The flow rate of the Rh precursor gas is preferably between about 15 sccm and 100 sccm. For the Pt precursor gas, the flow rate is preferably between about 5 sccm and 200 sccm. The pressure in the deposition chamber is between about 1 Torr and 80 Torr. The MOCVD temperature for Rh—Pt is between 300 C and 500 C, more preferably, between 350 C and 460 C. A preferred oxidizing gas is nitrous oxide ($N_2O$) with a flow rate of between about 100 sccm and 1500 sccm. Other oxidizing gases, such as NO, $O_2$, $O_3$ or $H_2O$ can also be used at flow rates between about 100 sccm and 1500 sccm.

Rhodium oxide is formed 230 directly over the rhodium-rich structure. In one embodiment, $RhO_x$ is formed by oxidizing a portion of the rhodium-rich layer. The oxidation is performed in an oxygen-containing atmosphere, such as O, $O_2$, NO, $N_2O$ or $H_2O$ and at a temperature preferably between about 300 C to 800 C, more preferably, between about 400 C and 700 C. The pressure in the chamber is between about 1 Torr and 660 Torr, and oxidation proceeds for between about 0.5 min and 3.0 min.

In another arrangement, the rhodium oxide structure can be formed directly by chemical vapor deposition, preferably using the precursor gas $Rh(\eta^5-C_5H_5)(CO)_2$ with a flow rate of between about 10 sccm and 100 sccm, an oxidizing agent (e.g., $N_2O$) at between 50 sccm and 1500 sccm, and a pressure of between about 1 Torr and 80 Torr. The deposition temperature is between 200 C and 550 C and, more preferably, between 300 C and 500 C. In the preferred embodiment, the film is subsequently annealed at preferably between about 350 C and 460 C, for about 0.5 minutes to 2.0 minutes to increase the grain size and reduce the carbon content of the film.

Even in the absence of a positive step of formation, generally some rhodium oxide will form 230 at the interface during subsequent deposition and annealing 240, of a high k dielectric layer (HDC) over the rhodium-rich structure.

The HDC layer can be formed of any material with a high dielectric constant, but preferably comprises barium strontium titanate. Generally barium strontium titanate (BST) can be formed with volatile reactants containing barium, strontium and titanium introduced into a chemical vapor deposition chamber along with an oxygen ambient. One exemplary process uses organometallic precursors incorporating tetramethyl heptanedionate (thd) reacted in a highly oxidizing environment within the process chamber. This group of exemplary precursors comprises $Ba(thd)_2$ and $Sr(thd)_2$ with either $Ti(isoproproxy)_2(thd)_2$ or $Ti(O-i-Pr)_2(thd)_2$. Preferably the chemical vapor deposition occurs in a temperature range of about 500 C to 800 C, more preferably, 600 C to 700 C. Another exemplary process uses precursors comprising $Ba(DPM)_2(tet)$, $Sr(DPM)_2(tet)$ and $Ti(O-i-C_3H_7)_4$ where DPM is bis(dipivaloylmethanato) and tet is tetraglyme. Preferably this deposition occurs in a temperature range of about 400 C to about 700 C. The BST layer is annealed subsequently at between 400 C and 650 C, more preferably at about 550 C, in an oxygen-containing atmosphere. An exemplary annealing atmosphere includes a mixture of $O_2$ and $N_2O$ at a pressure of between 50 Torr and 660 Torr, more preferably at about 660 Torr.

Alternatively, tantalum oxide ($Ta_2O_5$) can serve as the HDC layer. Tantalum oxide can be deposited by chemical vapor deposition using $Ta(OC_2H_5)_5$ gas carried by helium gas at a temperature between about 350 C and 550 C, more preferably between about 430 C and 500 C. The flow rate of the oxygen gas is between about 100 sccm and 1500 sccm, and the chamber pressure is between about 1 Torr and 20 Torr. The $Ta_2O_5$ is annealed at 400 C to 500 C in ultraviolet light for between about 30 seconds and 10 minutes, preferably, about 3 minutes, in an $O_2$ or $O_3$ atmosphere. Alternatively, the $Ta_2O_5$ layer can be annealed at 700 C to 850 C, preferably about 750 C, for 10 minutes to 2 hours, more preferably about 1 hour, in an oxygen or steam atmosphere.

Following HDC deposition 240, an upper rhodium oxide is preferably formed 250 directly over the HDC layer. In one embodiment, the rhodium oxide structure can be formed directly by chemical vapor deposition, as was discussed above for step 230. Alternatively, a layer of Rh metal having a thickness between about 1 nm and 10 nm, more preferably between about 2 nm and 5 nm, is deposited onto the HDC layer. This layer is then oxidized completely, as was described as one possibility for the first rhodium oxide formation 230. The finished oxide layer has a thickness about two times that of the initial rhodium metal layer.

An upper rhodium-rich structure is deposited 260 over the rhodium oxide. This deposition 260 can employ the same methods discussed earlier for step 220.

Figure 3:
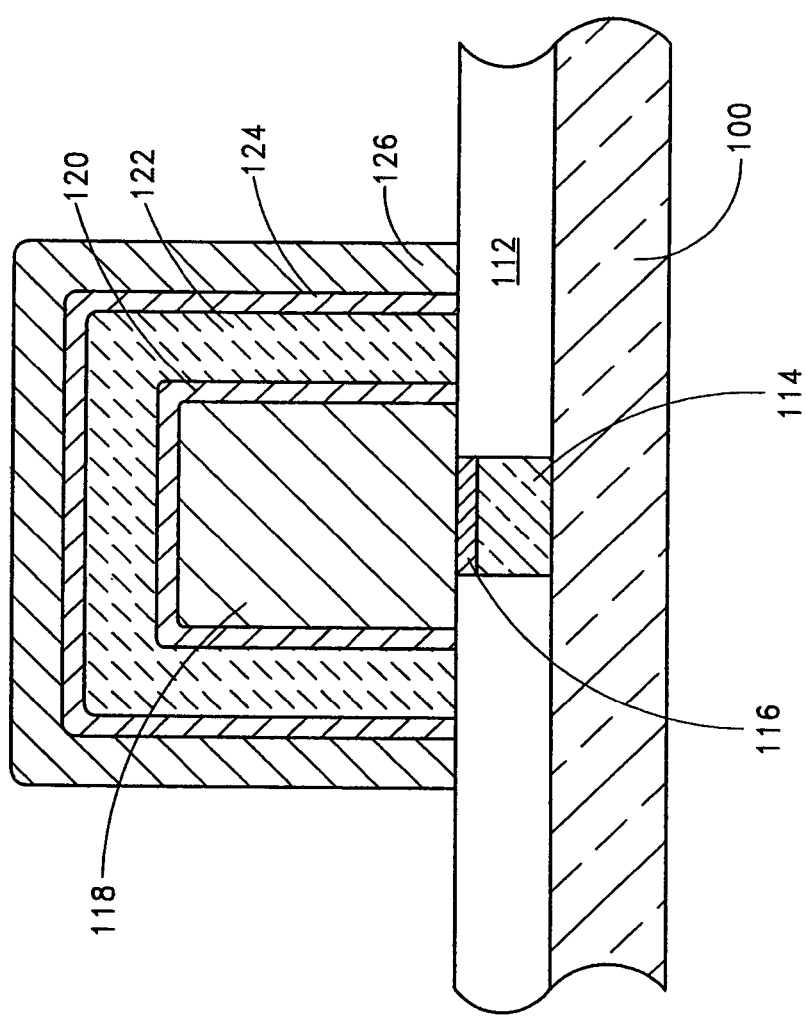
FIG. 3 is a cross-section of a stud capacitor with an exemplary five-layer structure, constructed according to an embodiment of the present invention.
Figure 4:
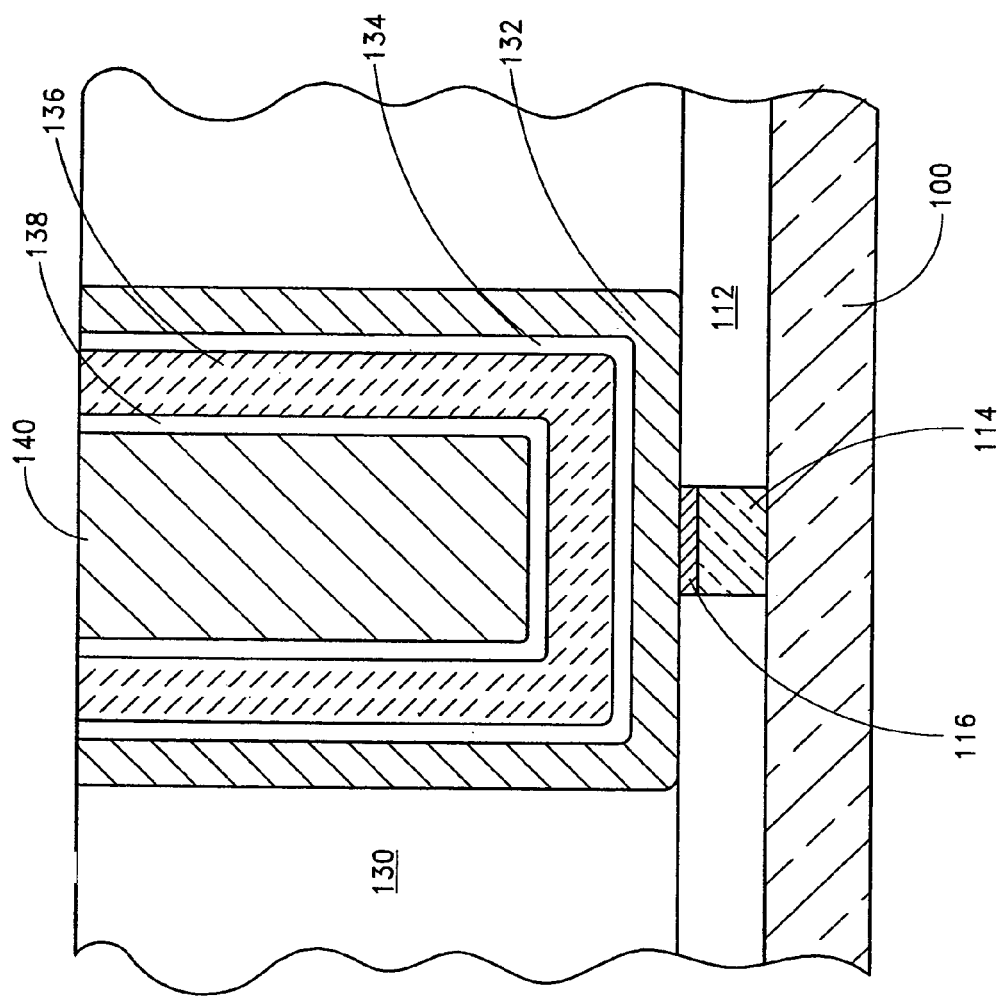
FIG. 4 is a cross-sectional view of a container capacitor with a five-layer structure according to an embodiment of the present invention.
Figure 5:
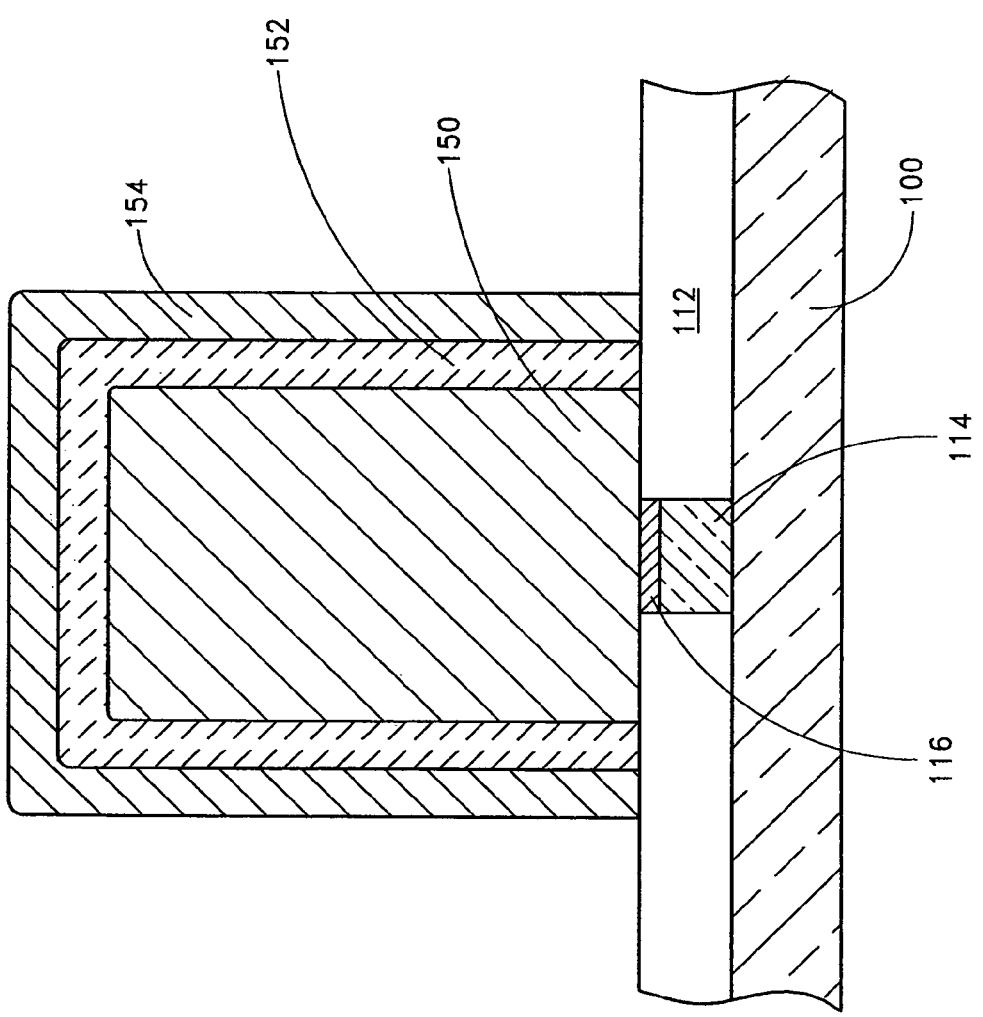
FIG. 5 is a schematic cross section of a stud capacitor with a three-layer structure, constructed according to an embodiment of the present invention.

Exemplary structures fabricated according to preferred embodiments of the current invention, are illustrated in FIGS. 3–5.

An exemplary stud capacitor can be understood with reference to FIG. 3, not drawn to scale. A portion of a silicon substrate 100 is shown with an insulating overlayer 112. There is a contact hole in the insulating layer 112 that is filled with polysilicon 114 and overlaid with a thin titanium nitride (TiN) or titanium silicon nitride ($TiSi_xN_y$) diffusion barrier layer 116. Preferably the thickness of the diffusion barrier layer is between about 40 nm and 200 nm. The capacitor structure is formed with an initial column of Pt 118, followed by a layer of Rh-rich Rh—Pt alloy 120, a layer of HDC 122, another Rh-rich Rh—Pt alloy layer 124, and finally another Pt layer 126. The diameter of the Pt column 118 is preferably between about 50 nm and 1000 nm, more preferably between about 50 nm and 500 nm. The thickness of each Rh-rich layer 120, 124 is preferably between about 20 nm and 100 nm, more preferably between 20 nm and 50 nm. The thickness of the HDC layer 122 is preferably between about 8 nm and 40 nm for BST and between about 3 nm and 20 nm for $Ta_2O_5$. The Pt layer 126 has a thickness of between about 10 nm and 100 nm, more preferably between about 20 nm and 50 nm.

Similarly, an exemplary container capacitor is illustrated in FIG. 4, not drawn to scale. Again, there is a silicon substrate 100 and a polysilicon plug 114 covered with a diffusion barrier layer 116. The plug 114 is formed in a contact hole in an insulating layer 112. A container hole has been formed in a thick insulating layer 130. The diameter of the container hole is preferably between about 50 nm and 1000 nm, more preferably between about 50 nm and 500 nm for a state-of-the art DRAM circuit design. The capacitor structure is formed with a Rh layer 132 conforming to the shape of the container. The thickness of the Rh layer 132 is preferably between about 20 nm and 100 nm, more preferably between about 20 nm and 50 nm. This is covered with $RhO_x$ 134, a layer of HDC 136 and another $RhO_x$ layer 138. The thickness of each $RhO_x$ layer is preferably between about 1.0 nm and 20.0 nm, more preferably between about 5.0 nm and 10.0 nm. The thickness of the HDC layer 136 is preferably between about 10 nm and 40 nm for BST and between about 3 nm and 20 nm for $Ta_2O_5$. The remaining opening is filled with Rh 140.

Another exemplary stud capacitor is shown in FIG. 5, not drawn to scale. The underlying structures are as described above for FIGS. 3 and 4. The capacitor structure includes a bottom electrode of Rh 150 in the shape of a stud that is covered with an HDC layer 152, and then with a layer of Rh comprising the top electrode 154. The diameter of the stud is preferably between about 50 nm and 1000 nm, more preferably between about 50 nm and 500 nm. The thickness of the HDC layer 152 is preferably between about 10 nm and 40 nm for BST and between about 3 nm and 20 nm for $Ta_2O_5$. The top layer of Rh is preferably between about 20 nm and 100 nm, more preferably between about 20 nm and 50 nm. A thin interfacial layer of rhodium oxide forms at the boundaries of the Rh layers 150, 154 and HDC layer 152.

Advantageously, the preferred embodiments provide processes and materials that are compatible with use of high dielectric materials for fabrication of capacitors in integrated circuits. Rhodium is very useful as an electrode, particularly adjacent to HDC's. Rhodium is also a good oxygen diffusion barrier and thus prevents outdiffusion of oxygen from the HDC, thereby protecting nearby materials in the integrated circuit from the detrimental effects of oxidation. Additionally, loss of oxygen from HDC materials causes undesirable changes in their dielectric properties. Because oxygen cannot diffuse out, it is trapped inside the HDC layer, thereby preserving its dielectric properties.

Much of the processing to form these structures involves highly oxidizing environments, and there is some oxidation of rhodium at the HDC/Rh interface. But as both rhodium and rhodium oxide have good electrical conductivity, the electrodes remain conductive. Rhodium oxide at the interface between rhodium rich structures and HDCs also serves as a diffusion barrier. Capacitors formed with HDC materials and rhodium tend not to degrade over time.

In the prior art, ruthenium oxide ($RuO_x$) has been used as an electrode material, but it is a strong oxidizer, and it tends to oxidize the surrounding materials. Platinum has also been used. Platinum does not oxidize, but does not form an effective barrier to oxygen diffusion. Thus, oxygen can diffuse through platinum and react with surrounding materials. Electrodes containing a high rhodium content can overcome there problems.

Although the foregoing invention has been described in terms of certain preferred embodiments, other embodiments will become apparent to those of ordinary skill in the art, in view of the disclosure herein. For example, while the preferred embodiments describe stud and container configurations, the skilled artisan will find application for the principles disclosed herein to more simple or more complex capacitor designs. Accordingly, the present invention is not intended to be limited by the recitation of preferred embodiments, but is intended to be defined solely by reference to the appended claims.

We claim:

1. An apparatus comprising:
   a memory device, where the memory device is configured to store data for the apparatus, the memory device comprising:
   a capacitor comprising:
   a first conductive layer in contact with a portion of a substrate assembly, where a material for the first conductive layer is selected from the group consisting of a noble metal, a metal alloy, a metal compound, polysilicon, and combinations thereof;
   a rhodium-rich structure between 20 nm and 100 nm in thickness, where the rhodium-rich structure is in contact with the first conductive layer;
   a rhodium oxide layer that is between 1 nm to 20 nm in thickness and is in direct contact with the rhodium-rich structure;
   a top electrode; and
   a capacitor dielectric disposed between the rhodium oxide layer and the top electrode.

2. The apparatus of claim 1, wherein the top electrode of the capacitor comprises a second rhodium-rich structure.

3. The apparatus of claim 2, wherein the top electrode comprises a substantially pure rhodium layer.

4. The apparatus of claim 2, wherein the second rhodium-rich structure comprises a noble metal alloy layer.

5. The apparatus of claim 4, wherein the noble metal alloy layer comprises a Rh—Pt alloy containing more than about 50 atomic percent Rh.

6. The apparatus of claim 2, wherein the top electrode comprises a second rhodium oxide layer between the dielectric and the second rhodium-rich structure of the top electrode.

7. The apparatus of claim 6, wherein each of the rhodium oxide layers is 1 nm to 20 nm thick.

8. The apparatus of claim 2, wherein each of the rhodium-rich structures is between 20 nm and 100 nm thick.

9. The apparatus of claim 1, wherein the capacitor dielectric comprises a material having a dielectric constant greater than about 5.

10. The apparatus of claim 1, wherein the capacitor dielectric comprises a material having a dielectric constant greater than about 10.

11. The apparatus of claim 1, wherein the capacitor dielectric comprises a material having a dielectric constant greater than about 20.

12. The apparatus of claim 1, wherein the capacitor dielectric comprises barium strontium titanate (BST).

13. The apparatus of claim 12, wherein the BST thickness is between 8 nm and 40 nm.

14. The apparatus of claim 1, wherein the capacitor dielectric comprises tantalum oxide ($Ta_2O_5$).

15. The apparatus of claim 14, wherein the $Ta_2O_5$ thickness is between 3 nm and 20 nm.

16. A system comprising:
a memory device, where the memory device is configured to store data for the system, the memory device comprising:
a capacitor comprising:
electrodes comprising rhodium-rich structures with a Rh—Pt alloy, wherein the Rh—Pt alloy contains at least 70% Rh; and
a dielectric layer disposed between the electrodes, where the dielectric layer has a dielectric constant greater than about 5.

17. The system of claim 16, wherein the integrated circuit memory device corresponds to a dynamic random access memory (DRAM).

18. An apparatus comprising:
a memory device, where the memory device is configured to store data for the apparatus, the memory device comprising:
a capacitor comprising:
electrodes at least one of the electrodes has at least a first layer and a second layer, where the first layer comprises a Rh—Pt alloy with at least 70% Rh, and where the second layer contains more than 50 atomic percent rhodium: and
a dielectric layer disposed between the electrodes, where the dielectric layer has a dielectric constant greater than about 5.

19. The apparatus of claim 18, wherein the thickness of the first layer is between 20 nm and 100 nm.

20. The apparatus of claim 18, wherein the first layer comprises Pt.

21. The apparatus of claim 20, wherein the first layer further comprises Rh.

22. The apparatus of claim 18, wherein the electrodes for capacitors correspond to both top electrodes and to bottom electrodes of capacitors.

23. An apparatus comprising:
a memory device, where the memory device is configured to store data for the apparatus, the memory device comprising:
a capacitor comprising:
electrodes, where at least one of the electrodes has a conductive structural layer, a bilayer rhodium-rich structure overlying the conductive structural layer, where the bilayer includes a first layer and a second layer, where the first layer is an alloy of rhodium and a noble metal, and where the second layer is at least 96% rhodium, and a layer of rhodium oxide overlying the second layer of the rhodium-rich structure; and
a dielectric layer disposed between the electrodes, where the dielectric layer has a dielectric constant greater than about 5.

24. The apparatus as defined in claim 23, where the first layer of the alloy of rhodium is rhodium-rich.

25. The apparatus as defined in claim 23, where the first layer of the alloy of rhodium is not rhodium-rich.

26. The apparatus as defined in claim 23, wherein the layer of rhodium oxide is configured to be adjacent to a high dielectric constant material of the capacitor such that the layer of rhodium oxide provides a barrier to oxygen diffusion from the high dielectric constant material.

27. The apparatus as defined in claim 23, wherein the conductive structural layer comprises at least on material selected from the group consisting of a noble metal, metal alloy, metal compound, polysilicon, and combinations thereof.

28. An apparatus comprising:
a substrate assembly with at least a semiconductor material; and
a memory device, where the memory device is configured to store data for the system, the memory device comprising:
a capacitor comprising:
electrodes for the capacitor, where at least one electrode comprises a conductive structural layer, a first layer of a rhodium-rich structure, a second layer of the rhodium-rich structure, and a layer of rhodium oxide, where the first layer overlies the conductive structure layer, where the second layer overlies the first layer, and where the layer of rhodium oxide overlies the second layer, where the first layer of the rhodium-rich structure comprises an alloy of rhodium and a noble metal, and where the second layer of the rhodium-rich structure comprises at least 96% rhodium; and
a dielectric layer disposed between the electrodes, where the dielectric layer has a dielectric constant greater than about 5.

29. The apparatus as defined in claim 28, where the first layer of the alloy of rhodium is rhodium-rich.

30. The apparatus as defined in claim 28, where the first layer of the alloy of rhodium is not rhodium-rich.

31. The apparatus as defined in claim 28, where the noble metal is selected from the group consisting of ruthenium, palladium, osmium, iridium, platinum, silver, and gold.

32. The apparatus as defined in claim 28, wherein the layer of rhodium oxide comprises an interfacial layer.

* * * * *